(12) United States Patent
Mimatsu (10) Patent No.: US 7,941,409 B2
(45) Date of Patent: May 10, 2011

(54) METHOD AND APPARATUS FOR MANAGING DATA COMPRESSION AND INTEGRITY IN A COMPUTER STORAGE SYSTEM

(75) Inventor: Yasuyuki Mimatsu, Cupertino, CA (US)

(73) Assignee: Hitachi, Ltd., Tokyo (JP)

( * ) Notice: Subject to any disclaimer, the term of this patent is extended or adjusted under 35 U.S.C. 154(b) by 508 days.

(21) Appl. No.: 11/898,232

(22) Filed: Sep. 11, 2007

(65) Prior Publication Data

US 2009/0070356 A1    Mar. 12, 2009

(51) Int. Cl.
G06F 17/00 (2006.01)
(52) U.S. Cl. .................................... 707/687; 707/698
(58) Field of Classification Search ............ 707/687, 707/690, 697, 698, 661, 667; 358/1.15; 360/8; 711/114; 709/229; 714/755
See application file for complete search history.

(56) References Cited

U.S. PATENT DOCUMENTS

| | | | |
|---|---|---|---|
| 5,237,460 A * | 8/1993 | Miller et al. ............... 360/8 |
| 6,807,632 B1 | 10/2004 | Carpentier et al. | |
| 7,200,603 B1 * | 4/2007 | Hitz et al. ................... 1/1 |
| 2002/0127000 A1 * | 9/2002 | Yamato et al. ............ 386/109 |
| 2003/0030575 A1 * | 2/2003 | Frachtenberg et al. ...... 341/51 |
| 2003/0204609 A1 * | 10/2003 | Anderson et al. ........... 709/229 |
| 2007/0260815 A1 * | 11/2007 | Guha et al. ................. 711/114 |
| 2008/0034268 A1 * | 2/2008 | Dodd et al. ................. 714/755 |
| 2008/0144079 A1 * | 6/2008 | Pandey et al. .............. 358/1.15 |

OTHER PUBLICATIONS http://www.snia.org/tech_activities/dmf/docs/ILMSolutions2004/ILM04_-_Why_CAS_Tutorial.pdf.

* cited by examiner

*Primary Examiner* — Hung T Vy
(74) *Attorney, Agent, or Firm* — Mattingly & Malur, P.C.

(57) ABSTRACT

A storage system stores discrete data units and corresponding metadata. The storage system receives data for storage, calculates a first hash value for the data, and identifies a set of compression conditions that correspond to a client ID associated with the data. When the compression conditions indicate that the data should be compressed, the data is compressed to create compressed data. Following compression of the data, the storage system calculates a second hash value for the compressed data, and stores the second hash value in the metadata, while also retaining the first hash value in the metadata. The storage system stores the compressed data, and deletes the uncompressed version of the data. An integrity check of the data stored in the storage system can be carried out periodically using the first or second hash values contained in metadata for each discrete data unit.

20 Claims, 11 Drawing Sheets

| Client ID | Condition Set ID |
|---|---|
| aaa | 0 |
| bbb | 1 |
| ... | ... |

Client Table

| Condition Set ID | Compression Condition Set |
|---|---|
| 0 | Condition Set 0 |
| 1 | Condition Set 1 |
| ... | ... |

Compression Condition Table

| Data Type | Max. Size Threshold | Min. Size Threshold | Capacity Saving Ratio Threshold | Algorithms used for compression |
|---|---|---|---|---|
| html | N/A | 8KB | N/A | Zip, Gzip, Bzip2 |
| wav | 2GB | 1MB | 30% | Flac |
| gif | 0 | N/A | N/A | N/A |
| ... | ... | ... | ... | ... |

4001 / 4002 / 4003 / 4004 / 4005

Condition Set

| Type | Metadata Attribute | Value |
|---|---|---|
| System | Hash Value of Original Data | XXXX |
| | Compression Status | Done |
| | Compression Algorithm | Gzip |
| | Hash Value of Compressed Data | YYYY |
| | Client ID | ZZZZ |
| | Data Type | AAAA |
| | Size of Original Data | BBBB |
| | Size of Compressed Data | CCCC |
| | ... | ... |
| User | Compression | Yes |
| | User designated tag | TTTT |
| | ... | ... |

Metadata

Process for a Read Request

FIG. 8

Background Process

FIG. 9

Data Compression

FIG. 10A

Data Compression (Cont.)
FIG. 10B

Data Integrity Check

FIG. 11

METHOD AND APPARATUS FOR MANAGING DATA COMPRESSION AND INTEGRITY IN A COMPUTER STORAGE SYSTEM

BACKGROUND OF THE INVENTION

1. Field of the Invention

The present invention relates generally to computer information technology systems and storage systems for storing data.

2. Description of Related Art

According to recent trends, a large amount of digital data is being archived in computer storage systems, such as disk array systems, in order comply with federal and state regulations, industry standards and practices, in addition to basic data archiving. For example, companies retain copies of email communications, data files, check images, and the like in archive storage systems. When a company has to retain and manage a massive volume of data over a long period of time, special purpose storage systems for data archiving are often used to reduce data management costs.

These storage systems have several functions that make it easier to safely retain and manage data for long periods of time. One of these functions is to keep management information (referred to hereafter as "metadata") related to the archived data. Some metadata, such as keywords used for searching the data, is determined and set by clients of the storage system, such as through an archive application. This type of metadata is called "user" metadata. Other types of metadata are set automatically by the storage system itself. These types of metadata are called "system" metadata. For example, some types of storage systems might automatically calculate and store a hash value as part of the metadata for each data entry. The hash value is calculated by a cryptographic hash function, such as MD5, SHA1, SHA256, or the like, as is known in the art. By periodically recalculating the hash values for the stored data and comparing the newly calculated hash values with stored hash values calculated when the data was first stored, a storage system can automatically perform a check to determine whether or not there has been an unexpected change in the stored data, such as due to degradation of the storage mediums or other equipment after a long period of, time. Additionally, some storage systems use the hash value, a part of a hash value, or a value derived from the hash value as an address of the archived data. In this case, the address of the data is called a content address, and these storage systems are referred to as CAS (Content Addressed Storage) systems. Related art includes U.S. Pat. No. 6,807,632, to Carpentier et al., entitled "Content Addressable Information Encapsulation, Representation, and Transfer", the entire disclosure of which is incorporated herein by reference.

However, while the above-described systems help reduce management costs, owners of large archive systems would also like to be able to reduce hardware costs as well. The fundamental solution for reducing hardware costs is to reduce the total amount of data stored in the archive systems, so that the required overall storage, capacity is reduced.

To reduce the amount of data stored in a storage system, data compression can be used as one solution. However, even after data is compressed, a hash value of the original data should not be removed because some applications might use the hash value as a content address, search key, or the like. Also, the hash value of the compressed data should be generated and maintained so that the storage system can use these to check the integrity of the data. If the storage system does not have the hash value of the compressed data, then the storage system must expand all the compressed data during each integrity check. Additionally, not every type of archived data is suitable for compression because some types of data, for example, images, audio files, and movies are already compressed before they are written to the storage system. Furthermore, it is not always effective to compress very small files because the amount of capacity actually saved is limited when compared with the CPU cycle consumed and the increase in access latency. Accordingly, there is a need for an ability to define and specify how and which data should be compressed, and then to effectively manage the compressed data along with the non-compressed data.

BRIEF SUMMARY OF THE INVENTION

Embodiments of the invention include methods and apparatuses to manage archived data in computer storage systems, such as for compressing the archived data and maintaining related metadata based on conditions defined by users. Embodiments of the invention reduce the amount of archived data stored by automatically compressing some data in a storage system based on conditions defined by users. Embodiments of the invention store and manage both compressed data and non-compressed data in a storage system. These and other features and advantages of the present invention will become apparent to those of ordinary skill in the art in view of the following detailed description of the preferred embodiments.

BRIEF DESCRIPTION OF THE DRAWINGS

The accompanying drawings, in conjunction with the general description given above, and the detailed description of the preferred embodiments given below, serve to illustrate and explain the principles of the preferred embodiments of the best mode of the invention presently contemplated.

DETAILED DESCRIPTION OF THE INVENTION

In the following detailed description of the invention, reference is made to the accompanying drawings which form a part of the disclosure, and, in which are shown by way of illustration, and not of limitation, specific embodiments by which the invention may be practiced. In the drawings, like numerals describe substantially similar components throughout the several views. Further, the drawings, the foregoing discussion, and following description are exemplary and explanatory only, and are not intended to limit the scope of the invention or this application in any manner.

Embodiments of the invention disclose a storage system that selectively compresses data stored therein. After data is stored in the storage system, the storage system checks whether the data should be compressed based on conditions defined by or for a user. The storage system automatically compresses data that the storage system determines should be compressed, and the storage system records the details of the compression in metadata and replaces the original data with the compressed data. Embodiments of the storage system also generate a hash value of the compressed data so that the storage system is able to check the integrity of compressed data without expanding the compressed data. A hash value of the original (non-compressed) data is also kept so that applications which store the data can use the original hash value as a content address for the data, as a search key, or the like.

System Architecture

Figure 1:
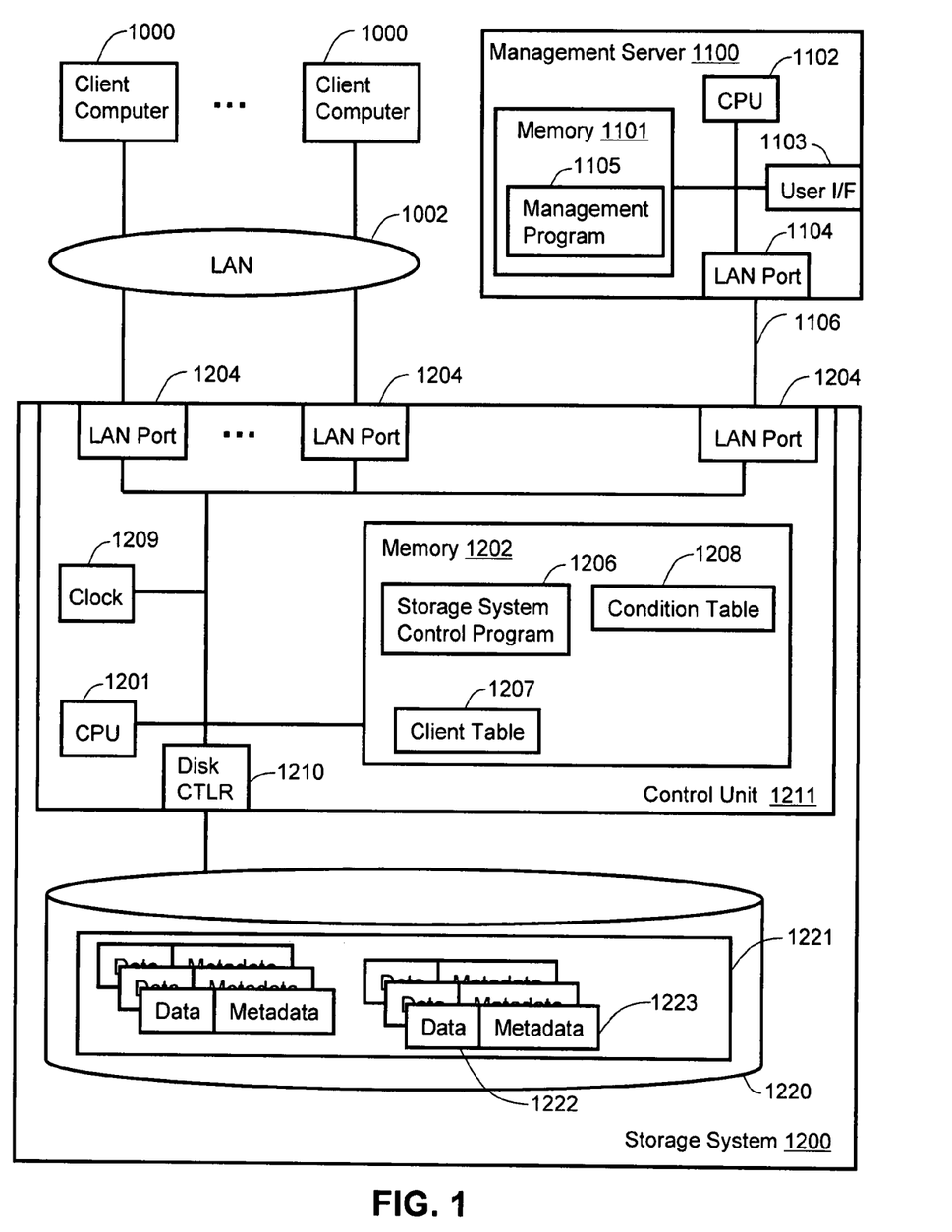
FIG. 1 illustrates an example of a hardware configuration in which the method and apparatus of the invention may be applied.

FIG. 1 illustrates an overview of an exemplary architecture of an information system in which the method and apparatus of the invention may be applied. One or more client computers 1000 are connected for communication with a storage system 1200 via a local area network (LAN) 1002. Client computers 1000 are able to access data and/or metadata stored in the storage system 1200 by issuing input/output (I/O) operations, such as READ or WRITE requests to storage system 1200 via LAN 1002. For example, if the storage system has a file system interface, the I/O requests may be issued via a standard NFS (Network File System) or CIFS (Common Internet File System) protocol, and may contain a path and file name to specify data and/or metadata which are stored as files. Files of data and metadata can be associated by a rule based on naming, placement, etc. On the other hand, if the storage system is a CAS system, the I/O requests may contain a content address and may be issued via an API (Application Program Interface) provided by a library installed in the client computers 1000. This invention is applicable to both of these storage system types and other storage systems known in the art.

Storage system 1200 is managed by an administrator from a management server 1100. Management server 1100 has a CPU 1102 which executes a management program 1105 stored in a memory 1101. The administrator uses management program 1105 to manage storage system 1200 by communication through a user interface 1103. Management server 1100 includes a LAN port 1104 for connecting management server 1100 for communication with storage system 1200 via a LAN cable 1106 or via LAN 1002. Thus, LAN 1106 can be unified with LAN 1002, or may be separate therefrom. Further, LAN 1002 may be any kind of network enabling communication, such as Ethernet, wireless, or the like. The administrator typically sends two types of requests under the invention to storage system 1200: a READ request and an UPDATE request. The READ request reads the client table 1207 and compression condition table 1208. The administrator is able to use user I/F 1103 to cause management program 1105 to set or modify these tables, and send an UPDATE request to update these tables in the storage system 1200, thus replacing existing tables with new updated tables.

Storage system 1200 has a control unit 1211 that includes one or more LAN ports 1204 to enable communication with client computers 1000 and management server 1100. Storage system 1200 also includes one or more storage devices, such as disk drives 1220 providing storage mediums on which data 1222 and metadata 1223 are stored. In some embodiments, data 1222 and metadata 1223 may also be cached in memory 1202. One or more logical containers 1221 may be created in each disk drive 1220, or from multiple disk drives 1220. For example, if the storage system implements a file system interface, the logical container is formed as a file system in a logical unit and data and metadata are stored as files. On the other hand, if the storage system is a CAS system, the logical container may be formed as an object pool and the pair of data and metadata can stored as an object comprised of the data and the metadata. For simplicity, one disk drive and one logical container are illustrated in FIG. 1, but in alternative embodiments multiple disk drives and multiple containers may be provided. Further, while the storage devices 1220 illustrated in this embodiment are described as disk drives, in other embodiments, solid state memory, optical drives, or the like may be used.

CPU 1201 executes a storage system control program 1206 in memory 1202, or other computer readable medium. Storage system control program 1206 not only processes I/O operations, such as READ and WRITE requests sent from clients, but also executes a background process of data compression and integrity checking. The timing of execution of the background process is determined by referring to a clock 1209. Storage system control program 1206 also communicates with management server 1100 and processes management requests for reading and updating conditions defined by a user on a client computer 1000 or the administrator on the management server 1100.

Figure 2:
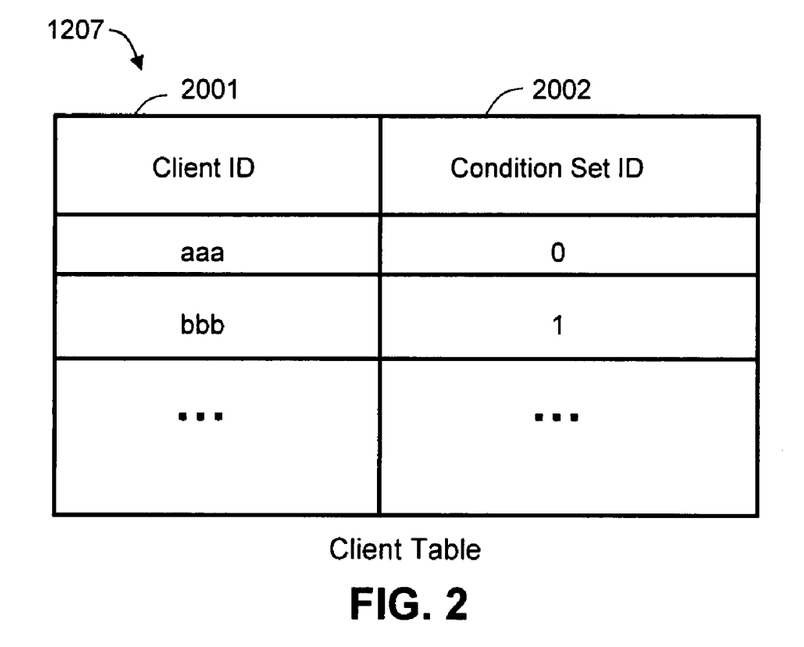
FIG. 2 illustrates an exemplary data structure of a client table.

In memory 1202, there is included a client table 1207, as illustrated in FIG. 2, which defines a condition set for each client. In FIG. 2, client table 1207 includes al client identifier (ID) entry 2001 that contains IDs of clients. For example, a client ID can be an IP address, UID/GID (user ID/group ID), and so on. Client table 1207 correlates the client IDs 2001 with IDs of condition set entries 2002 assigned to or set for each client listed in client table 1207. Client table 1207 is used in conjunction with a compression condition table 1208 and one or more condition sets 3002 to provide detailed control over how and when each client's data is compressed.

Figure 3:
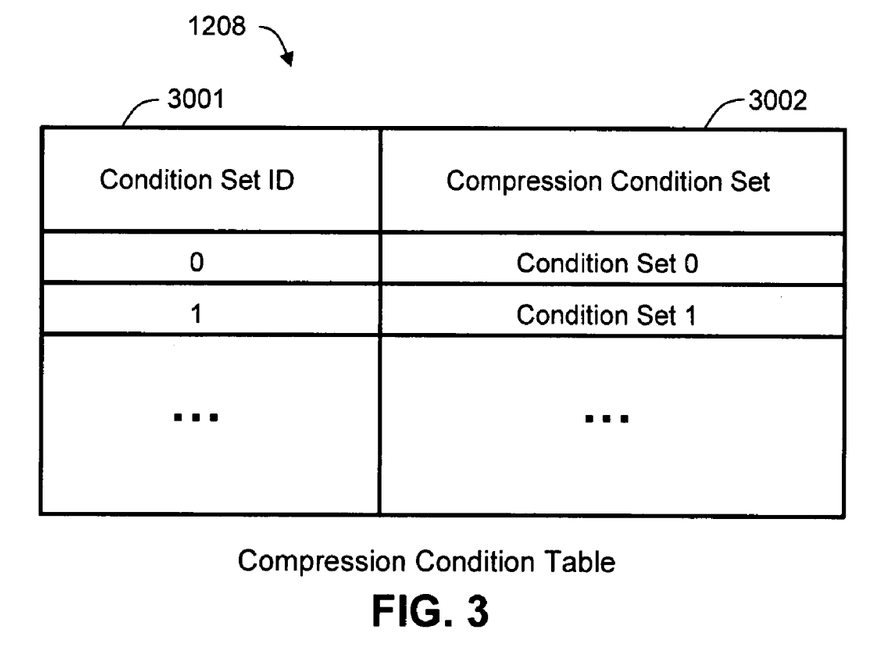
FIG. 3 illustrates an exemplary data structure of a compression condition table.

Compression condition table 1208, as illustrated in FIG. 3, may be stored in memory 1202 of storage system 1200, and contains one or more compression condition sets 3002. Each condition set 3002 is identified by a condition set ID 3001, and is maintained in condition table 1208. A large variety of condition sets 3002 can be generated, depending on the needs of the users of the storage system 1200. Further, while condition sets are associated with clients and; client IDs in this embodiment through client table 1207, in other embodiments, condition sets may be associated with logical partitions in the storage system, particular logical volumes, or the like.

Figure 4:
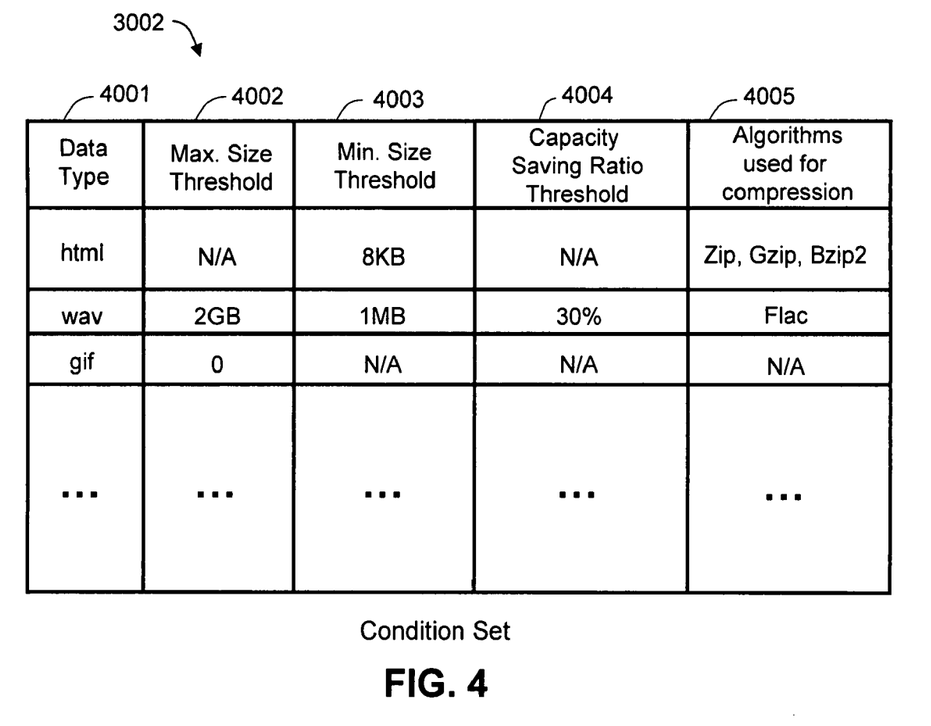
FIG. 4 illustrates an exemplary data structure of a condition set.

An example of the details of a compression condition set 3002 corresponding to a condition set ID 3001 is illustrated in FIG. 4. Each condition set 3002 includes compression conditions for particular types of data, and includes a data type entry 4001 that describes the type of data that the compression conditions apply to. The data type 4001 can be defined by, for example, file type name extension identifiers, such as html, wav, tif, gif, pdf, txt, doc, or the like. Max size 4002 and Min size 4003 define a maximum and minimum size of data which may be compressed, respectively. If these values are N/A, there is no restriction in terms of data size. Further, it is possible to prevent particular data types from being compressed by specifying "0" as the Max size 4002. For example, if a particular data type is already in a compressed format, then there is no advantage gained by attempting to further compress the data. Also, as discussed above, a minimum size for compression might be useful because the amount of space saved by compressing a small file may not warrant the added processing overhead created.

Condition set 3002 also includes a threshold ratio 4004 for compression efficiency that defines the minimum capacity saving ratio that should be able to be achieved as a result of the compression, i.e., the minimum ratio of the size of the compressed data compared with the size of the original data. If the predicted capacity saving ratio is smaller than or equal to the specified threshold 4004, then the data will not be compressed. For example, the second entry in condition set 3002 illustrated in FIG. 4 specifies how a "wav" file is treated in this condition set. If a wav file to be archived is larger than 2 GB or smaller than 1 MB, then the file will not be compressed. Additionally, if it is predicted that following compression the compressed data will not be at least 30 percent smaller than the original data, then the file will not be compressed. On the other hand, if a wav file is between 2 GB and 1 MB in size, and compression will result in a reduction of size of more than 30 percent, then the file will be compressed.

Algorithms 4005 define compression algorithms to be used for the each data type 4001. For example, in FIG. 4, data of type "html" will be stored as compressed data by a "Zip", "Gzip" or "Bzip2" algorithm if the original data size is greater than 8 KB. Data of type "wav" will be stored as compressed data by a "FLAC" (Free Lossless Audio Codec) algorithm if the original data size is smaller than 2 GB and greater than 1 MB and the capacity saving ratio is greater than 30%. Depending on the use of the particular storage system 1200, numerous other data types 4001 may typically be included in each condition set 3002. The compression conditions for each data type may be specified or set by the client or the administrator according to client preferences, desired results, or the like.

Metadata

Figure 5:
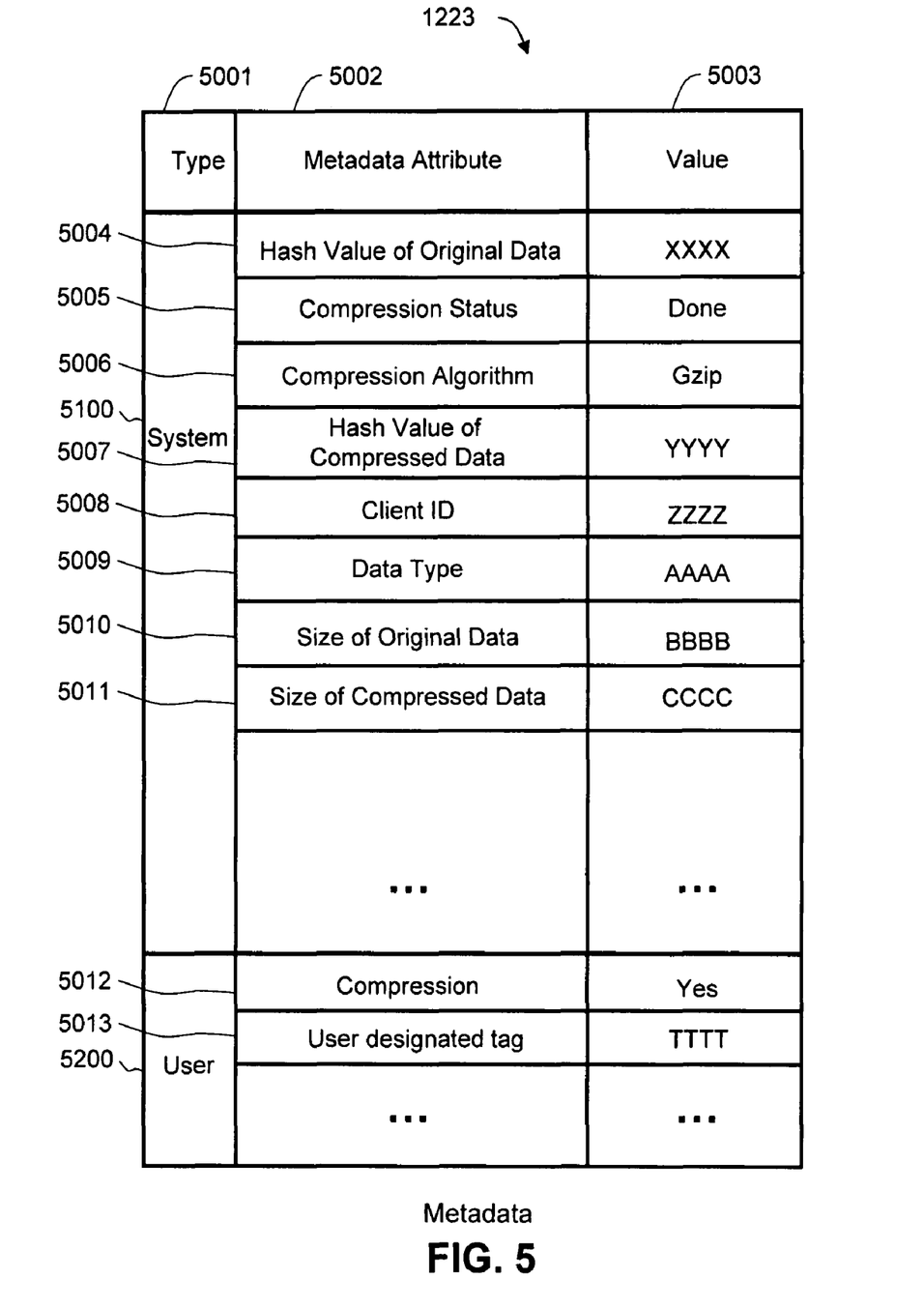
FIG. 5 illustrates an exemplary data structure of metadata.

Each unit of data 1222 has metadata 1223 associated with it. For example, if the discrete data unit to be stored is a file, the file will have metadata associated with it, such as size, file name, owner, and the like. In some cases, the data itself might be referred to as the content data in order to distinguish from the metadata associated with the content data. As illustrated in FIG. 5, metadata 1223 can be categorized into two types 5001: (1) system metadata 5100 which is set by the storage system control program and which cannot be modified by a user; and (2) user metadata 5200 which is able to be set by a user, such as a client or administrator. FIG. 5 illustrates various metadata attributes 5002 and the values 5003 associated with each metadata attribute 5002. In FIG. 5, a hash value of original data 5004 is a hash value of the original data, i.e., as calculated before the data is compressed, if compression is to be performed. A compression status 5005 can be set to "Done" or "Not Done". "Done" means that the storage system control program has made a determination as to whether or not the particular data associated with the metadata should be compressed. "Not Done" means that the storage control program has not yet made this determination. A compression algorithm 5006 is set to the name of the algorithm used to compress the data if the data is compressed. A hash value of compressed data 5007 is set to a hash value of compressed data calculated after the data is compressed, if compression is performed. A client ID 5008 is the ID of the client that writes the data to the storage system for storage. A data type 5009 is the type of the data, as discussed with respect to data type entry 4001 above in the condition set 3002. A size of original data 5010 is the size of the original data, such as the number of bytes. A size of compressed data 5011 is the size of the data following compression, such as the number of bytes. Having both the size of the original data and the size of the compressed data enables a user to determiner the effectiveness of the compression. User metadata attributes, such as compression 5012 is set to "YES" or "NO". "YES" means that the user allows the storage system 1200 to perform compression on the data, while a "NO" means that the user does not want the data to be compressed. A user designated tag 5013 can be a name or keyword designated by the user to be used to locate the data, such as for searching purposes. Other system and user metadata attributes may also be used, with it being understood that the foregoing are exemplary.

Processing Requests from Clients and Management Server

Figure 6:
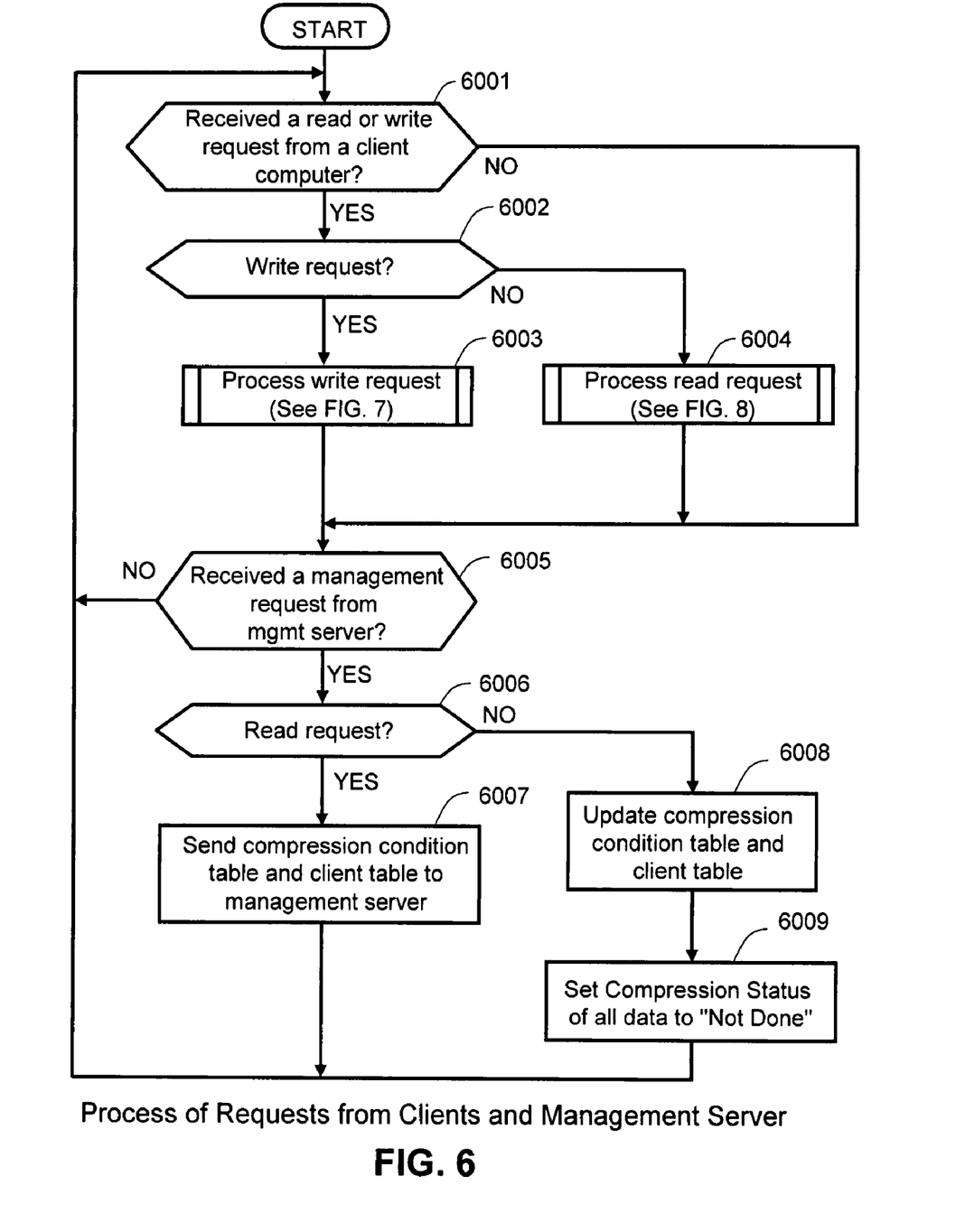
FIG. 6 illustrates an exemplary process flow of a storage system control program to process requests sent from the clients and the management server.

FIG. 6 illustrates a flow of storage system control program 1206 for processing requests sent from client computers 1000 and/or management server 1100.

At step 6001, storage system control program 1206 receives a request and determines whether it is from a client computer.

At step 6002, storage system control program 1206 identifies the type of request as a Read request or a Write request.

Figure 7:
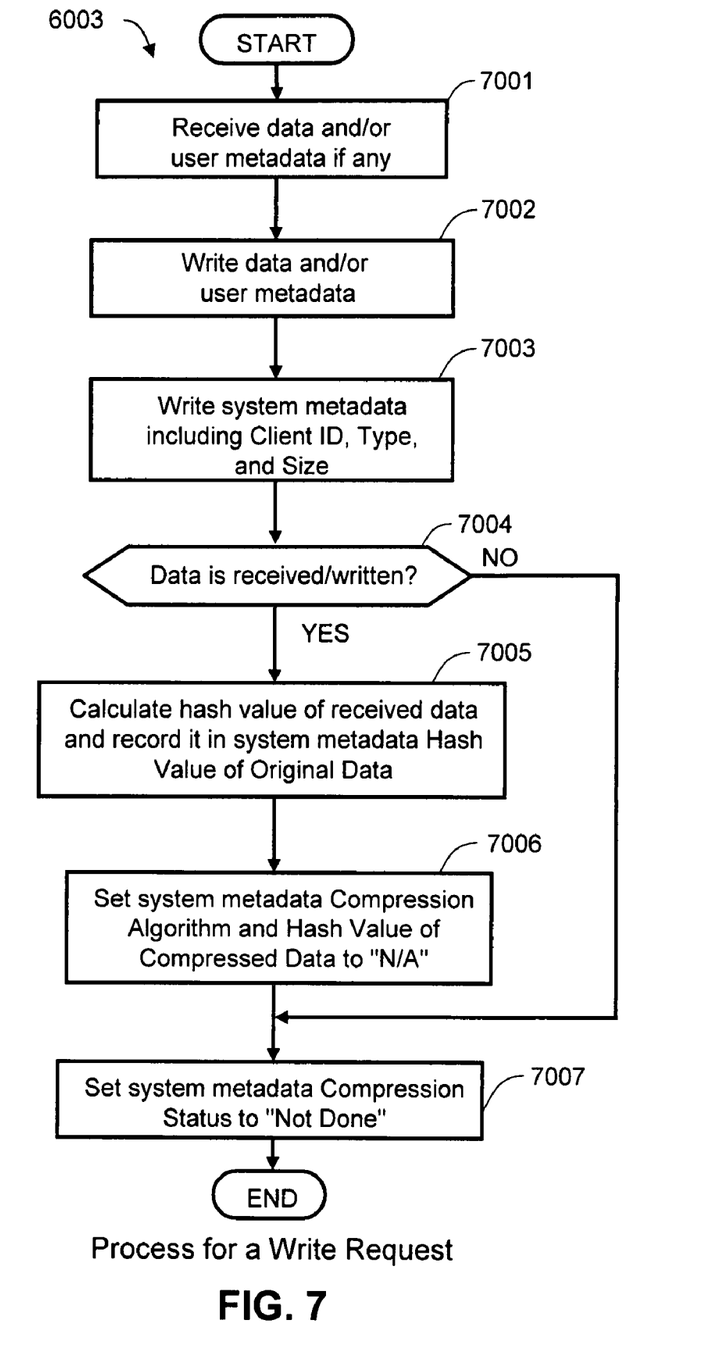
FIG. 7 illustrates an exemplary process flow of a WRITE request sent from a client.

At step 6003, when the request from the client computer is a Write request, storage system control program 1206 carries out the process set forth in FIG. 7.

Figure 8:
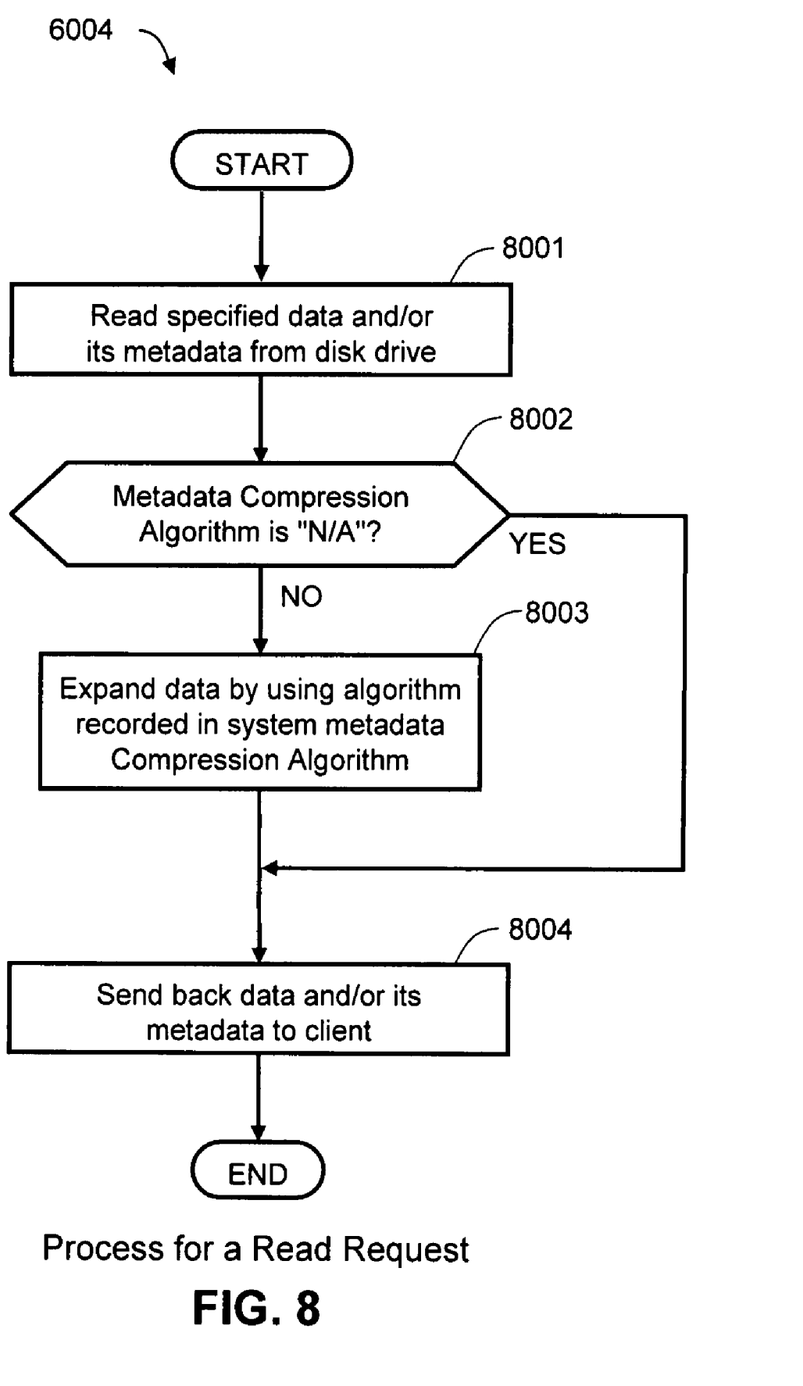
FIG. 8 illustrates an exemplary process flow of a READ request sent from a client.

At step 6004, when the request from the client computer is a Read request, storage system control program 1206 carries out the process set forth in FIG. 8.

At step 6005, when the request is not a request from a client computer, storage system control program 1206 determines whether the request is from the management server 1100.

At step 6006, when the request is from the management server, storage system control program 1206 determines whether the request is Read request, or whether it is an Update request.

At step 6007, when the request from the management server is a Read request, storage system control program sends client table 1207 and compression condition table 1208 to the management server in response to the Read request.

At step 6008, when the request from the management server is an Update request, storage system control program 1206 receives an updated client table 1207 and/or an updated compression condition table 1208 from management server 1100 and updates the existing tables. After the tables 1207 and/or 1208 are updated, storage system control program 1206 sets compression status metadata 5005 of all data in the storage system affected by the updates to "Not Done" so that this data will be checked to determine whether or not the data is compressed in conformance with any new compression conditions that may have been set in the updated tables 1207, 1208.

FIG. 7 illustrates a detailed flow of a process carried out in step 6003 of FIG. 6 by storage system control program 1206 when a Write request is received from a client computer 1000.

At step 7001, storage system control program receives data 1222 and/or user metadata sent from client computer 1000.

At step 7002, storage system control program 1206 stores the data 1222 and/or user metadata to a cache in memory 1202 or to disk drive 1220.

At step 7003, storage system control program 1206 creates system metadata of the data 1222 and includes this with any user metadata received at step 7001 for storing as metadata 1223 corresponding to data 1222. As discussed above, the system metadata may include a client ID 5008, data type 5009, and original size 5010.

At step 7004, storage system control program 1206 determines if data (i.e., content data) was received and written at step 7001 (i.e., instead of or in addition to user metadata, since it is possible that only user metadata, such as a search tag might be written).

At step 7005, storage system control program 1206 calculates a hash value of the received data and records the result in the system metadata as the hash value of the original data 5004.

At step 7006, storage system control program 1206 sets compression algorithm 5006 and hash value of compressed data 5005 to "N/A", since a determination on compression has not yet been made for this data.

At step 7007, storage system control program 1206 sets system metadata compression status to "Not Done". These steps make sure that metadata is updated when data is written to the storage system. If only user metadata is modified by the client, the storage system control program does not modify system metadata related to compression because the data itself remains unchanged. However, the storage system control program changes the compression status 5005 to "Not Done" so that the data will be checked to determine whether or not it is compressed to ensure conformance with the new user metadata.

FIG. 8 illustrates the detailed flow of the processing carried out in step 6004 of FIG. 6 when a READ request is received from a client computer.

At step.8001, storage system control program 1206 reads data 1222 and/or metadata 1223 specified in the read request from disk drives 1220.

At step 8002, storage system control program 1206 determines if the data is compressed by referring to the corresponding metadata. For example, if the compression algorithm 5006 is set as "N/A", then the data is not compressed.

At step 8003, storage system control program 1206, expands (uncompresses) the specified data by using the algorithm recorded in system metadata compression algorithm entry 5006.

At step 8004, storage system control program 1206 sends back the data and/or requested metadata to the requesting client computer. These steps allow clients to read both compressed data and non-compressed data by using the same access interface.

Process for Data Compression and Integrity Checking

Figure 9:
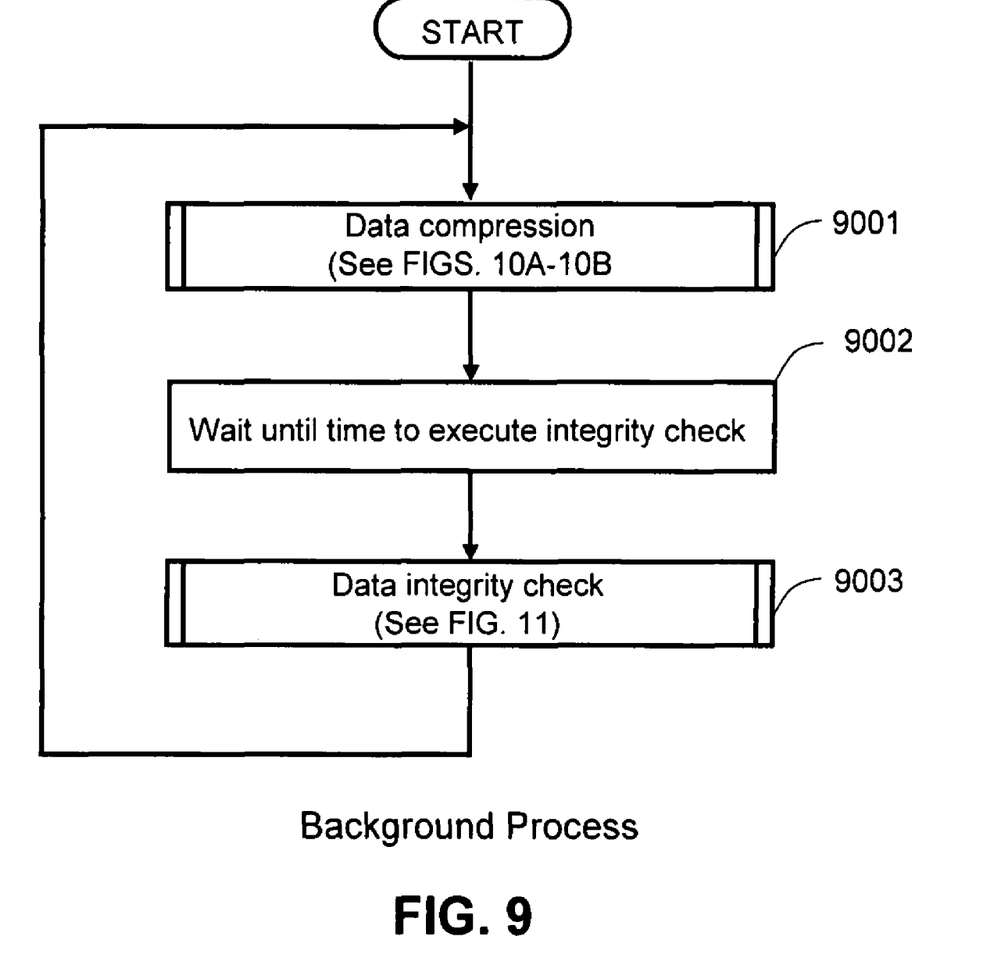
FIG. 9 illustrates an exemplary process flow of a background process of the storage system control program.

FIG. 9 illustrates the flow of a background process of storage system control program 1206. This background process and the process illustrated in FIG. 6 run simultaneously in storage system control program 1206. The compression of the data in this embodiment is carried out as a background process to avoid performance degradation that might occur if data is compressed in real time. Periodic integrity checks of the data stored in the storage system are also carried out by the storage system control program 1206 as a background process, as discussed above, to ensure that storage mediums have not degraded, or the like, and the interaction of these: two processes is explained further with reference to FIG. 9.

At step 9001, for each data unit (i.e., file, object, etc.), storage system control program 1206 investigates whether or not compression of the data is specified/allowed by and compresses the data if compression is indicated. Details of step 9001 are set forth in FIGS. 10A-10B, as described further below.

At step 9002, after completion of the compression process, storage system control program 1206 waits until it is time to execute a periodic integrity check of the data stored in the storage system.

At step 9003, when the time to carry out the periodic integrity check has arrived, then for each data, storage system control program 1206 checks whether or not there is an unexpected change in the data.

Figure 10A:
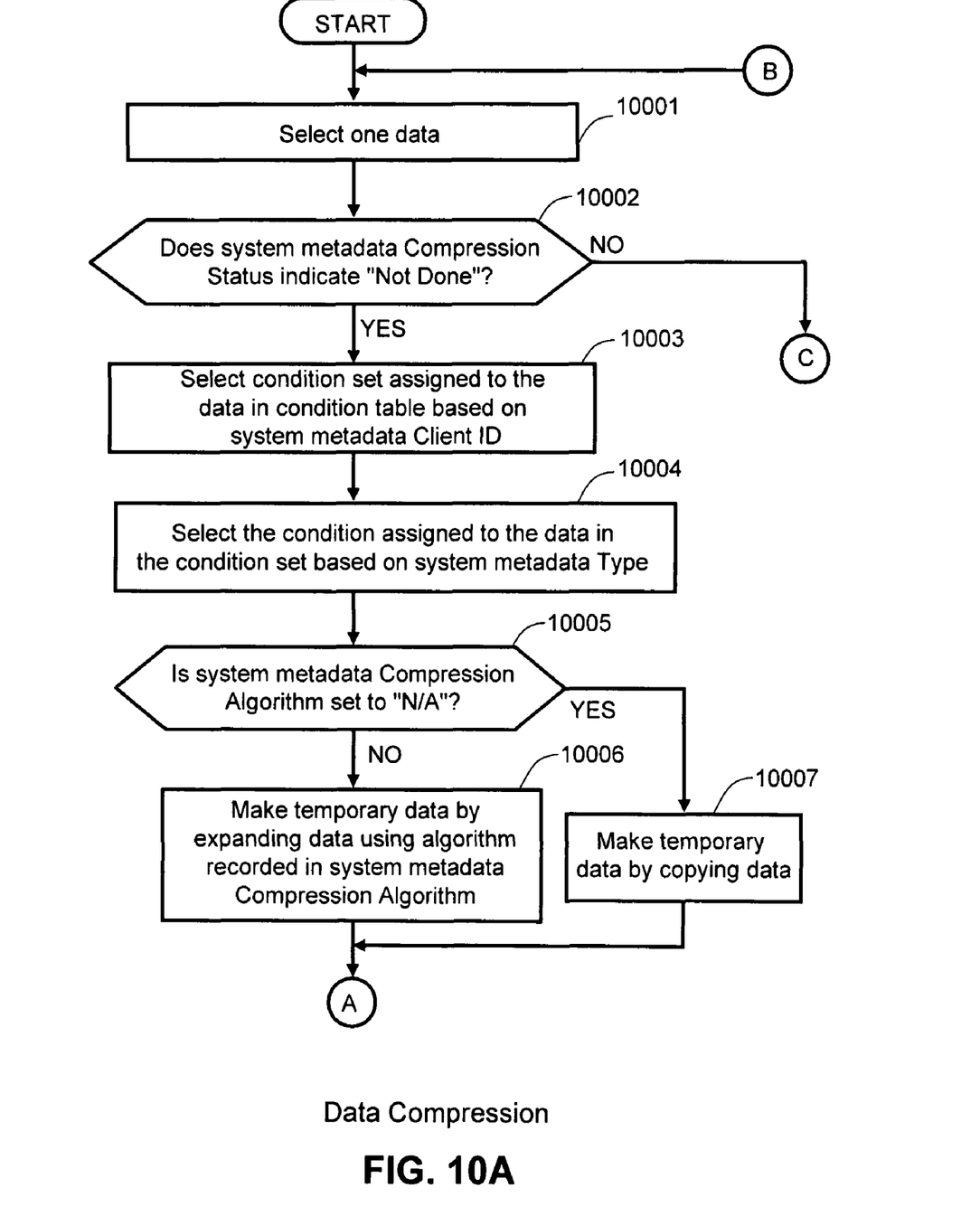
FIGS. 10A-10B illustrates an exemplary process flow carried out for step 9001 of FIG. 9 to determine whether compression of the data is required and how compression is carried out.
Figure 10B:
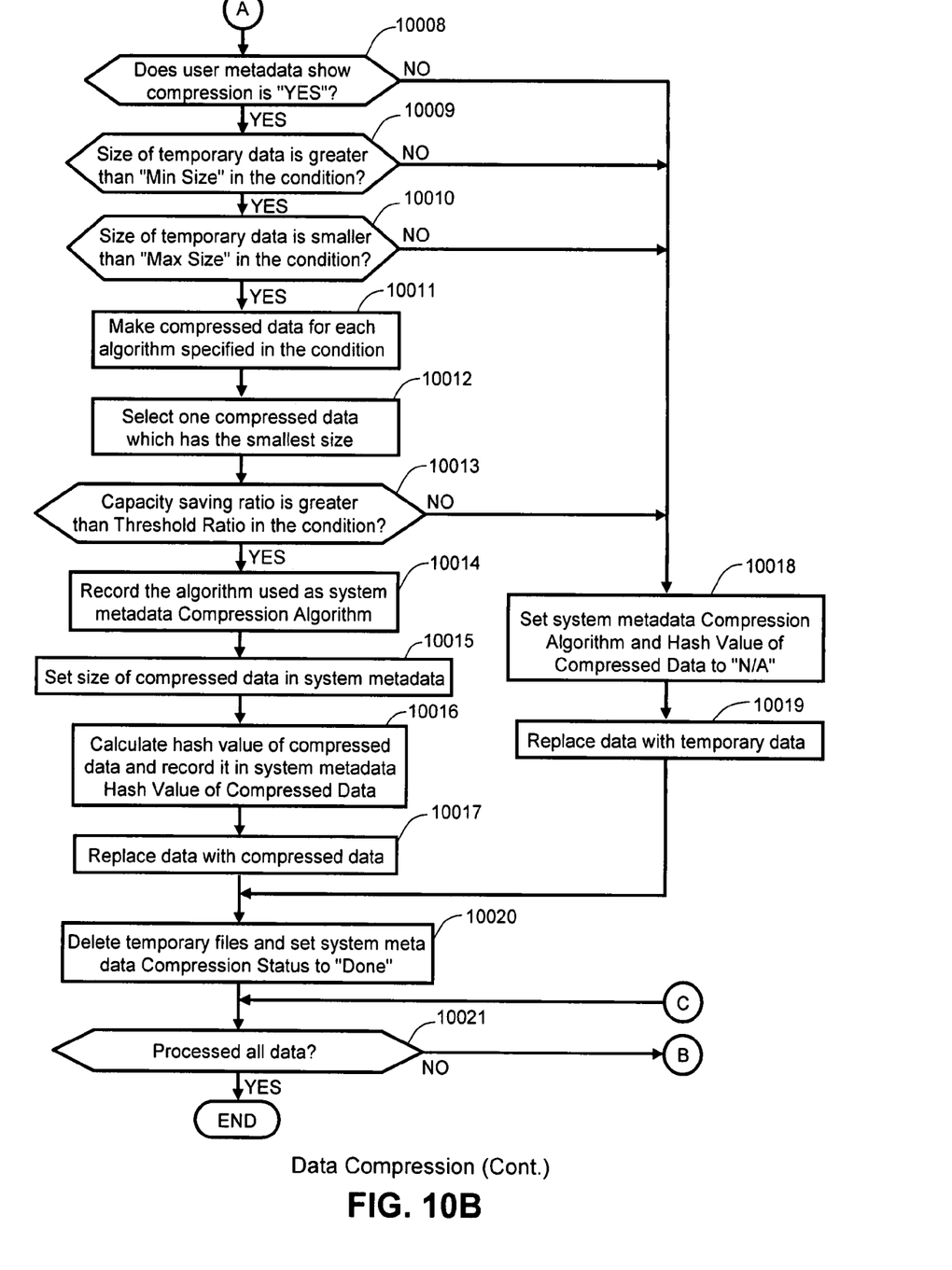

FIGS. 10A and 10B illustrate the details of step 9001 of FIG. 9 for determining if compression is indicated, and carrying out compression when compression is indicated.

At step 10001, storage system control program 1206 selects one discrete data 1222 (i.e., a data unit such as a file, object, or the like) to be processed, and retrieves the metadata 1223 for the selected data.

At step 10002, storage system control program 1206 checks whether the compression status 5005 of the selected metadata 1223 indicates whether the compression status is "Done" or "Not Done". When the compression status 5005 indicates "Done" then the process goes to step 10021 in FIG. 10B because this particular data does not have to be processed further. Otherwise, if the compression status 5005 indicates "Not Done", then the process goes to step 10003.

At step 10003, storage system control program 1206 determines the client ID 5008 for the selected data from metadata 1223, and then determines a particular condition set corresponding to the client ID from client table 1207 and compression condition table 1208.

At step 10004, storage system control program 1206 determines the data type 5009 of the selected data from metadata 1223, selects a condition entry in the condition set selected in step 10003 based on the corresponding data type entry 4001 that matches the data type 5009 in the metadata 1223. In following steps, storage system control program 1206 make decisions based on the selected condition entry.

At step 10005, storage system control program 1206 determines whether compression algorithm 5006 in the selected metadata 1223 is set to "N/A".

At step 10006, when storage system control program 1206 determines that the compression algorithm entry 5006 of the metadata is not set to "N/A", this means that a specified algorithm has already been used to compress the data, and the name of the specified algorithm is stored at compression algorithm entry 5006 of metadata 1223. Storage system control program creates a temporary data by expanding the compressed data using the algorithm recorded as compression algorithm 5006 in metadata 1223.

Otherwise, at step 10007, storage system control program 1206 creates a temporary data by copying the selected data, and it is not necessary to uncompress the data, because the "N/A" as the entry for the compression algorithm 5006 indicates that the data is not compressed.

At step 10008, storage system control program 1206 determines whether or not the data may be compressed based on whether user metadata compression entry 5012 indicates compression as "Yes".

At step 10009, when compression is indicated as a "Yes" in compression entry 5012, storage system control program 1206 determines whether or not the data may be compressed based on whether the size of the temporary data is greater than the minimum size threshold 4003, if any.

At step 10010, when the size of the temporary data is greater than the minimum size threshold 4003, storage system control program 1206 determines whether or not the data may be compressed based on whether the size of the temporary data is less than the maximum size threshold 4002, if any.

At step 10011, when storage system control program 1206 has determined that the data may be compressed based on comparison of the temporary data with the condition thresholds, storage system control program 1206 creates compressed data by using the one or more algorithms specified in the condition.

At step 10012, storage system control program 1206 selects the compressed data having the smallest size when multiple algorithms are specified.

At step 10013, storage system control program 1206 determines if the capacity saving ratio of the size of the smallest compressed data compared to the size of the temporary data is greater than the capacity saving ratio threshold 4004 set in the condition, if any.

At step 10014, when the capacity saving ratio achieved by the compression is greater than the threshold ratio 4004, the storage system control program 1206 records the algorithm used to achieve the smallest size of compressed data in the system metadata compression algorithm entry 5006.

At step 10015, storage system control program 1206 sets the size of the compressed data 5011 in system metadata 1223.

At step 10016, storage system control program 1206 calculates and records hash value of the compressed data 5007 in system metadata 1223.

At step 10017, storage system control program 1206 stores the compressed data and deletes the original data, thereby replacing the original data with the compressed data.

At step 10018, when a determination is made that the data should not be compressed, either because of user metadata or failure to meet the condition thresholds, storage system control program 1206 sets system metadata compression algorithm 5006 and hash value of compressed data 5007 to "N/A".

At step 10019, storage system control program 1206 stores the temporary data and deletes the existing data, thereby effectively replacing the existing data with the temporary data which is not compressed.

At step 10020, storage system control program 1206 deletes any remaining temporary files and sets system metadata compression status 5005 to "Done".

At step 10021, storage system control program 1206 repeats the above steps for each unit of data in the storage system.

The steps set forth in FIGS. 10A-10B ensure that data is compressed if the conditions which are defined by the user are met, and also specify appropriate data to be compressed and effective algorithms to be used for compression. The hash value of the original data 5004 is maintained in the metadata 1223 corresponding to each data 1222, so that the hash value of the original data can be used as a search key or content address by clients even after the data has been compressed. For example, in a CAS storage system, when the data is compressed, the hash value of they compressed data can be used as the new address. However, a client computer may only know the uncompressed address, According to the invention, the hash value of the original data 5004 can be correlated with the hash value of the compressed data 5007. This enables the hash value of the original data to be used to locate the compressed data, which can then be expanded and returned to the requesting client. The steps of FIGS. 10A-10B also ensure that if conditions are updated, existing data is compressed according to the new conditions, or no longer compressed if the conditions for compression are no longer met.

Process of Data Integrity Check

Figure 11:
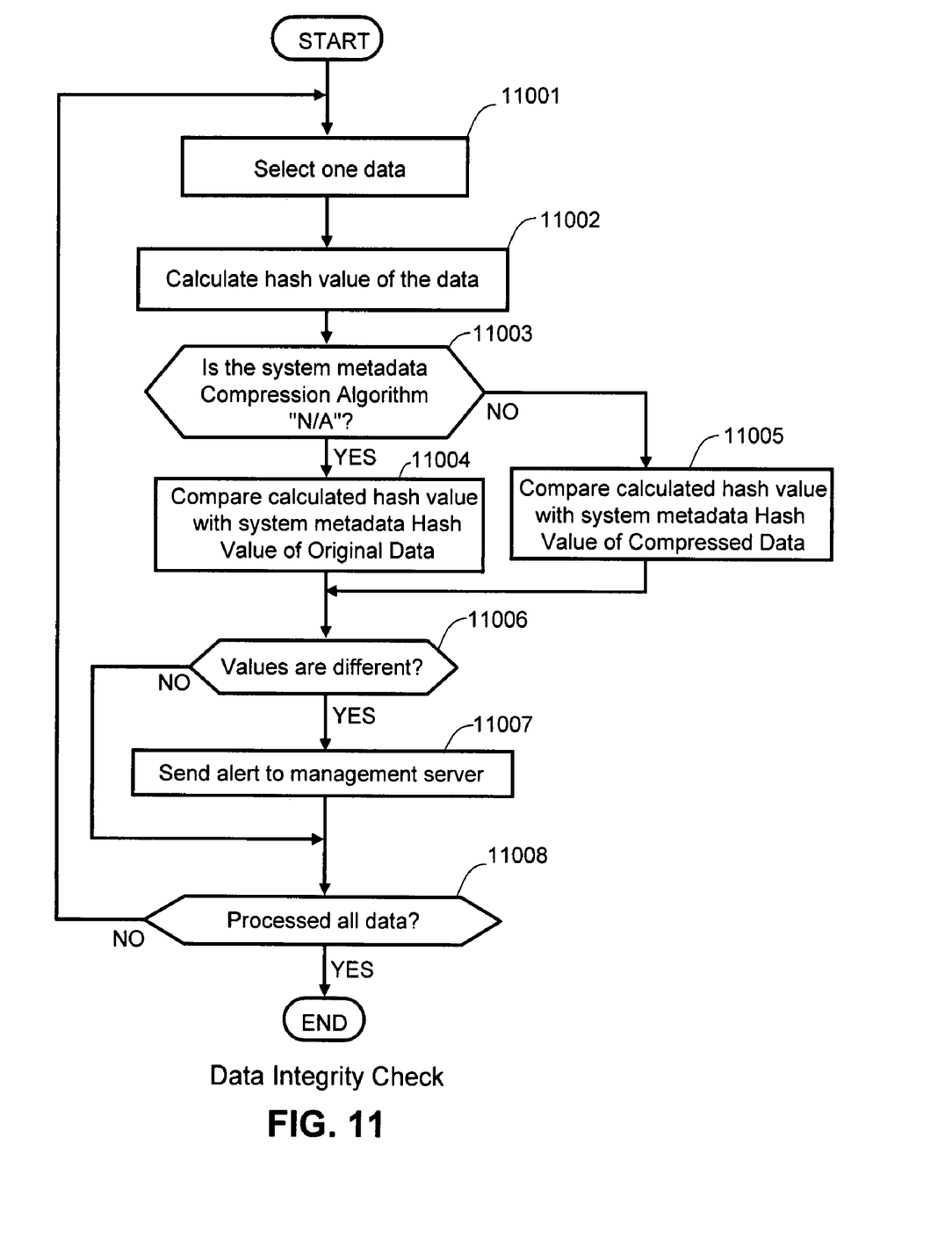
FIG. 11 illustrates an exemplary process flow of a data integrity check carried out for step 9003 of FIG. 9.

FIG. 11 illustrates the process flow of a periodic data integrity check of step 9003 of FIG. 9 carried out in the storage system of the invention.

At step 11001, storage system control program 1206 selects one data unit (i.e., file, data object, or the like) to be checked.

At step 11002, storage system control program 1206 calculates a new hash value for the data selected in step 11001.

At step 11003, storage system control program 1206 determines whether compression algorithm entry 5006 of metadata 1223 is "N/A", which indicates that the data is not compressed.

At step 11004, when compression algorithm 5006 is "N/A", the data is not compressed, so storage system control program 1206 compares the calculated new hash value with the hash value of original data 5004 stored in metadata 1223 for the selected data.

At step 11005, on the other hand, when compression algorithm 5006 is not "N/A", that indicates that the data is compressed, and then storage system control program 1206 compares the calculated new hash value with the hash value of compressed data 5007 stored in the corresponding metadata.

At step 11006, storage system control program 1206 determines whether the hash values compared in either steps 11004 or 11005 are different.

At step 11007, when the compared hash values are different, storage system control program 1206, sends an alert to the management server because there has been an unexpected change in the data.

At step 11008, storage system control program 1206 returns to the beginning until the process has been repeated for each data stored in the storage system. Accordingly, the data integrity checking method of the invention enables the storage system control program 1206 to check the integrity of the compressed data without expanding the compressed data.

This invention is used to provide a method and apparatus which reduces the amount of data stored by automatically compressing the data stored in the storage system based on conditions defined by users. The invention provides a method and apparatus which stores and manages both compressed data and non-compressed data in a storage system. The conditions defined by the users are able to specify appropriate data to be compressed and effective algorithms to be used for compressing the data. If the conditions are changed, the storage system checks whether or not each data is compressed in accordance with the new or modified conditions and re-executes the compression, if necessary, in accordance with the new or modified conditions. Further, the storage system generates a hash value for the compressed data so that the storage system can check the continuing integrity of the compressed data without expanding the compressed data. The hash value of the original data is also maintained even when the data is compressed so that applications which store the data can use the original hash value as a content address, a search key, or the like.

From the foregoing, it will be apparent that the invention provides an improved method and apparatus for compressing data in a storage system. Additionally, while specific embodiments have been illustrated and described in this specification, those of ordinary skill in the art appreciate that any arrangement that is calculated to achieve the same purpose may be substituted for the specific embodiments disclosed. This disclosure is intended to cover any and all adaptations or variations of the present invention, and it is to be understood that the above description has been made in an illustrative fashion, and not a restrictive one. Accordingly, the scope of the invention should properly be determined with reference to the appended claims, along with the full range of equivalents to which such claims are entitled.

What is claimed is:

1. A storage system comprising:
a control unit in communication with at least one storage device, said at least one storage device storing data including one or more data units and corresponding metadata for each data unit, each metadata describing attributes of one of said corresponding data units,
wherein said control unit is configured to calculate a first hash value based on content of each data unit and store the first hash value as part of the metadata corresponding to that data unit,
wherein said control unit is configured to determine whether said data units should be compressed, and compress the data units when a result of said determination indicates the data units should be compressed, and
wherein for each data unit that is compressed, said control unit is configured to calculate a second hash value based on content of that compressed data unit following compression and store the second hash value as part of the metadata corresponding to that data unit in addition to retaining said first hash value as part of the metadata corresponding to that data unit.

2. A storage system according to claim 1,
wherein, for each said data unit that is compressed, after storing the compressed data unit, said control unit is configured to delete any uncompressed version of said data unit.

3. A storage system according to claim 1,
wherein said control unit is configured to conduct a periodic integrity check of the data stored in said at least one storage device by calculating a new hash value based on content of each data unit and compressed data unit stored in the at least one storage device at the time of the integrity check,
wherein said control unit is configured to determine from said corresponding metadata whether a particular data unit is compressed or not compressed, and compare said new hash value with the first hash value in said corresponding metadata when said particular data unit is not compressed and compare said new hash value with the second hash value in said corresponding metadata when said particular data unit is compressed,
whereby the storage system checks the integrity of both compressed data and non-compressed data without expanding the compressed data.

4. A storage system according to claim 1, further comprising:
a compression condition set stored in said storage system corresponding with one or more of said data units via a client identifier (ID) contained in said metadata for said one or more data units,
wherein said compression condition set indicates conditions under which said one or more data units should be compressed.

5. A storage system according to claim 4,
wherein said conditions contained in said compression condition set include a compression efficiency ratio threshold, wherein said data units are compressed unless compression results in a decreased size of the data units in comparison with an original size that at least surpasses said compression efficiency ratio threshold specified for said data units.

6. A storage system according to claim 1,
wherein said conditions contained in said compression condition set include at least one of a specified minimum size and a specified maximum size of a data unit for compression, and
wherein a particular data unit is not compressed if the particular data unit is smaller than the specified minimum size or larger than the specified maximum size in the compression condition set corresponding to the particular data unit.

7. A storage system according to claim 1,
wherein said metadata for each data unit includes system metadata and user metadata,
wherein both the system metadata and the user metadata are accessible by a client that owns the data, and
wherein the client can modify the client metadata, but cannot modify the system metadata.

8. A storage system according to claim 1,
wherein a particular first hash value is used to attempt to locate a particular data unit stored in the storage system, the particular first hash value having been calculated based on content of the particular data unit prior to compression,
wherein a particular second hash value has been calculated based on content of the compressed data unit following compression and stored as part of the metadata corresponding to the particular data unit along with the particular first hash value,
wherein said storage system correlates the particular first hash value with the particular second hash value using said metadata corresponding to said particular data unit to locate a corresponding compressed data unit that corresponds to said particular second hash value.

9. A method of operating a storage system, comprising:
receiving, by a control unit, a first data for storage in a storage device in communication with said control unit;
identifying a set of compression conditions that correspond to a client identifier associated with said first data;
determining whether said compression conditions indicate said first data should be compressed;
compressing said first data to create first compressed data when said compression conditions indicate the first data should be compressed;
storing said first compressed data in said storage device and deleting said first data;
calculating a first hash value based on content of the first data prior to compressing said first data;
storing said first hash value in metadata corresponding to said first data;
following compression of said first data, calculating a second hash value based on content of said first compressed data; and
storing said second hash value in said metadata corresponding to said first data while also retaining said first hash value in said metadata.

10. A method according to claim 9, further comprising steps of
conducting a periodic integrity check of data stored in said at least one storage device by:
calculating a new hash value based on content of each of discrete data units and compressed data units stored in the at least one storage device at the time of the integrity check,
determining from said corresponding metadata whether a particular data unit is compressed or not compressed, and
comparing said new hash value with the first hash value in said corresponding metadata when said particular data unit is not compressed and comparing said new hash value with the second hash value in said corresponding metadata when said particular data unit is compressed, whereby the storage system checks the integrity of both compressed data and non-compressed data without expanding the compressed data.

11. A method according to claim 9,
wherein said compression conditions include a compression efficiency ratio threshold, such that said first data is not compressed unless compression results in a decreased size in comparison with an original size that at least surpasses said compression efficiency ratio threshold specified for said first data; and said step of determining whether said compression conditions indicate said first data should be compressed includes compressing said first data and comparing a size of said first compressed data with a size of said first data to determine if said compression efficiency ratio threshold is met, wherein when said compression efficiency ratio threshold is not met, said first compressed data is deleted and said first data is stored in said one or more storage devices.

12. A method according to claim 9,
wherein said compression conditions include at least one of a specified minimum size and a specified maximum size of data for compression, and said step of determining whether said compression conditions indicate said first data should be compressed includes determining that the first data should not be compressed if the first data is smaller than the specified minimum size or larger than the specified maximum size in the compression conditions corresponding to the first data.

13. A method according to claim 9, further comprising steps of
updating one or more compression conditions stored in said storage system by changing one or more compression conditions contained therein; and performing a process of determining whether discrete data units stored in said one or more storage devices should remain compressed, remain uncompressed, be compressed or be uncompressed as a result of the update to said one or more compression conditions.

14. A storage system, comprising:
a control unit in communication with at least one storage device, said at least one storage device storing data including one or more discrete data units and corresponding metadata for each data unit, each metadata describing attributes of one of said corresponding data units, wherein, when said control unit receives a first data unit for storage in the storage device, said control unit is configured to identify a set of compression conditions that correspond to a client identifier associated with said first data unit, wherein said control unit determines whether said compression conditions indicate said first data unit should be compressed, wherein said control unit compresses said first data unit to create a compressed first data unit when said compression conditions indicate the first data unit should be compressed, stores said compressed first data unit in said storage device, and deletes said first data unit;

wherein said control unit calculates a first hash value based on content of the first data unit prior to compressing said first data unit and stores said first hash value in metadata corresponding to said first data unit; and wherein, following compression of said first data unit, said control unit calculates a second hash value based on content of said compressed first data unit, and stores said second hash value in said metadata corresponding to said first data unit while also retaining said first hash value in said metadata.

15. A storage system according to claim 14,
wherein said control unit is configured to conduct a periodic integrity check of the data stored in said at least one storage device by calculating a new hash value based on content of each data unit and compressed data unit stored in the at least one storage device at the time of the integrity check, wherein said control unit determines from said corresponding metadata whether a particular data unit is compressed or not compressed, and compares said new hash value with the first hash value in said corresponding metadata when said particular data unit is not compressed and compares said new hash value with the second hash value in said corresponding metadata when said particular data unit is compressed, and whereby the storage system checks the integrity of both compressed data and non-compressed data without expanding the compressed data.

16. A storage system according to claim 14,
wherein said compression conditions include a compression efficiency ratio threshold, such that said first data unit is not compressed unless compression results in a decreased size in comparison with an original size that at least surpasses said compression efficiency ratio threshold specified for said first data unit, wherein said control unit compresses said first data unit and compares a size of said compressed first data unit with a size of said first data unit to determine if said compression efficiency ratio threshold is met, and wherein when said compression efficiency ratio threshold is not met, said compressed first data unit is deleted and said first data unit is stored in said one or more storage devices.

17. A storage system according to claim 14,
wherein said compression conditions include at least one of a specified minimum size and a specified maximum size of data for compression, and wherein said control unit determines that the first data unit should not be compressed if the first data unit is smaller than the specified minimum size or larger than the specified maximum size set forth in the compression conditions corresponding to the first data unit.

18. A storage system according to claim 14,
wherein when one or more compression conditions stored in said storage system are updated by changing one or more compression conditions contained therein, said control unit is configured to perform a process of determining whether the data units stored in said one or more storage devices should remain compressed, remain uncompressed, be compressed or be uncompressed as a result of the update to said one or more compression conditions.

19. A method according to claim 9, further comprising:
correlating the first hash value with the second hash value which are stored in the metadata; and using the first hash value to locate the compressed data associated with the second hash value which is correlated with the first hash value.

20. A storage system according to claim 14, wherein the control unit is configured to correlate the first hash value with the second hash value which are stored in the metadata, thereby enabling the first hash value to be used to locate the compressed data associated with the second hash value which is correlated with the first hash value.

\* \* \* \* \*